(12) United States Patent
Fujiyoshi et al.

(10) Patent No.: US 11,327,100 B2
(45) Date of Patent: May 10, 2022

(54) ELECTROSTATIC SENSOR AND DOOR HANDLE

(71) Applicant: ALPS ALPINE CO., LTD., Tokyo (JP)

(72) Inventors: Tatsumi Fujiyoshi, Miyagi (JP); Takashi Sasaki, Miyagi (JP); Tomoki Yamada, Miyagi (JP)

(73) Assignee: ALPS ALPINE CO., LTD., Tokyo (JP)

( * ) Notice: Subject to any disclaimer, the term of this patent is extended or adjusted under 35 U.S.C. 154(b) by 299 days.

(21) Appl. No.: 16/833,886

(22) Filed: Mar. 30, 2020

(65) Prior Publication Data

US 2020/0225269 A1 Jul. 16, 2020

Related U.S. Application Data

(63) Continuation of application No. PCT/JP2018/033868, filed on Sep. 12, 2018.

(30) Foreign Application Priority Data

Oct. 4, 2017 (JP) .............................. JP2017-194297

(51) Int. Cl.
*G01R 27/26* (2006.01)
*B60J 5/04* (2006.01)
(Continued)

(52) U.S. Cl.
CPC ............ *G01R 27/2605* (2013.01); *B60J 5/04* (2013.01); *E05B 81/76* (2013.01); *G01V 3/08* (2013.01);
(Continued)

(58) Field of Classification Search
CPC .. G01R 27/2605; G01R 31/312; G01N 27/22; G01N 27/223; H03K 17/955;
(Continued)

(56) References Cited

U.S. PATENT DOCUMENTS 6,593,755 B1 * 7/2003 Rosengren ........... H03K 17/955
324/662
9,151,792 B1 * 10/2015 Kremin ................... G06F 1/169
(Continued)

FOREIGN PATENT DOCUMENTS

JP 2000-080703 3/2000
JP 2005-227225 8/2005
(Continued)

OTHER PUBLICATIONS

International Search Report for PCT/JP2018/033868 dated Dec. 4, 2018.

*Primary Examiner* — Amy He
(74) *Attorney, Agent, or Firm* — IPUSA, PLLC

(57) ABSTRACT

An electrostatic sensor includes a detection electrode, a shield electrode provided in a periphery of the detection electrode, a first power supply coupled to the detection electrode and configured to generate an AC voltage having a first amplitude, a second power supply coupled to the shield electrode and configured to generate an AC voltage having a second amplitude, a measuring device configured to measure a quantity of charge flowing from the first power supply to the detection electrode, and a control device coupled to the measuring device. The AC voltages generated by the first and second power supplies have the same frequency and the same phase. The second amplitude is larger than the first amplitude. A detection target on a side of a detection surface is detected based on a change in an electrostatic capacitance between the detection electrode and the detection target.

20 Claims, 12 Drawing Sheets

(51) Int. Cl.
*E05B 81/76* (2014.01)
*G01V 3/08* (2006.01)
*H03K 17/955* (2006.01)
*G06F 3/044* (2006.01)
*G06F 3/041* (2006.01)

(52) U.S. Cl.
CPC .............. *G06F 3/041* (2013.01); *G06F 3/044* (2013.01); *H03K 17/955* (2013.01); *H03K 2217/96078* (2013.01); *H03K 2217/960765* (2013.01)

(58) Field of Classification Search
CPC ..... H03K 17/962; H03K 2217/960765; H03K 2217/96078; G06F 3/044; G06F 3/041; G01V 3/08; G01V 3/06; E05B 81/76; E05B 81/77; E05B 77/34
See application file for complete search history.

(56) References Cited

U.S. PATENT DOCUMENTS

| | | | |
|---|---|---|---|
| 2002/0000813 | A1* | 1/2002 | Hirono ............... G01R 27/2605 324/690 |
| 2004/0201384 | A1 | 10/2004 | Berkel |
| 2012/0112767 | A1 | 5/2012 | Nonogaki |
| 2012/0161953 | A1 | 6/2012 | Nakagawa |
| 2016/0087629 | A1 | 3/2016 | Nishiyama |
| 2017/0254633 | A1* | 9/2017 | Tanahashi ............ H03K 17/955 |

FOREIGN PATENT DOCUMENTS

| | | |
|---|---|---|
| JP | 2006-515665 | 6/2006 |
| JP | 2009-079353 | 4/2009 |
| JP | 2010-286384 | 12/2010 |
| JP | 2012-141137 | 7/2012 |
| JP | 2014-228335 | 12/2014 |
| WO | 2011/024306 | 3/2011 |

* cited by examiner

ELECTROSTATIC SENSOR AND DOOR HANDLE

CROSS-REFERENCE TO RELATED APPLICATIONS

This application is a continuation application of International Application No. PCT/JP2018/033868 filed on Sep. 12, 2018 and designated the U.S., which is based upon and claims priority to Japanese Patent Application No. 2017-194297, filed on Oct. 4, 2017, the entire contents of which are incorporated herein by reference.

BACKGROUND OF THE INVENTION

1. Field of the Invention

The present invention relates to an electrostatic sensor and a door handle.

2. Description of the Related Art

A door of an automobile or the like is provided with a door handle for opening and closing the door, and the door handle is provided on an outer side of the automobile or the like. A door handle having an integrated electrostatic sensor has been proposed, that enables the operation of opening and closing the door of the automobile or the like without touching the door handle. An example of such a door handle is described in Japanese Laid-Open Patent Publication No. 2009-79353, for example.

However, the automobile or the like may be parked outside, and when rainfall or the like occurs, raindrops may cause water droplets to adhere on the door handle. The relative dielectric constant of water is approximately 80, and when the water droplets are erroneously recognized as a finger or the like, an erroneous detection occurs. When the erroneous detection occurs, an undesirable operation, not intended by an owner of the automobile or the like, may be performed.

For this reason, there are demands for electrostatic sensors that can distinguish between adhesion of water droplets and an operation made by the finger or the like, to prevent the erroneous detection caused by the water droplets.

SUMMARY OF THE INVENTION

One object of the present disclosure is to enable an electrostatic sensor to distinguish between adhesion of water droplets and an operation made by a finger or the like, so as to prevent an erroneous detection caused by the water droplets.

According to one aspect of the embodiments, an electrostatic sensor includes a detection electrode; a shield electrode provided in a periphery of the detection electrode; a first AC power supply, coupled to the detection electrode, and configured to generate an AC voltage having a first voltage amplitude; a second AC power supply, coupled to the shield electrode, and configured to generate an AC voltage having a second voltage amplitude; a charge quantity measuring device configured to measure a quantity of charge flowing from the first AC power supply to the detection electrode; and a control device coupled to the charge quantity measuring device, wherein the AC voltage generated by the first AC power supply and the AC voltage generated by the second AC power supply have the same frequency and the same phase, wherein the second voltage amplitude of the AC voltage generated by the second AC power supply is larger than the first voltage amplitude of the AC voltage generated by the first AC power supply, and wherein a detection target on a side of a detection surface is detected based on a change in an electrostatic capacitance between the detection electrode and the detection target.

Other objects and further features of the present invention will be apparent from the following detailed description when read in conjunction with the accompanying drawings.

DESCRIPTION OF THE PREFERRED EMBODIMENTS

Figure 1:
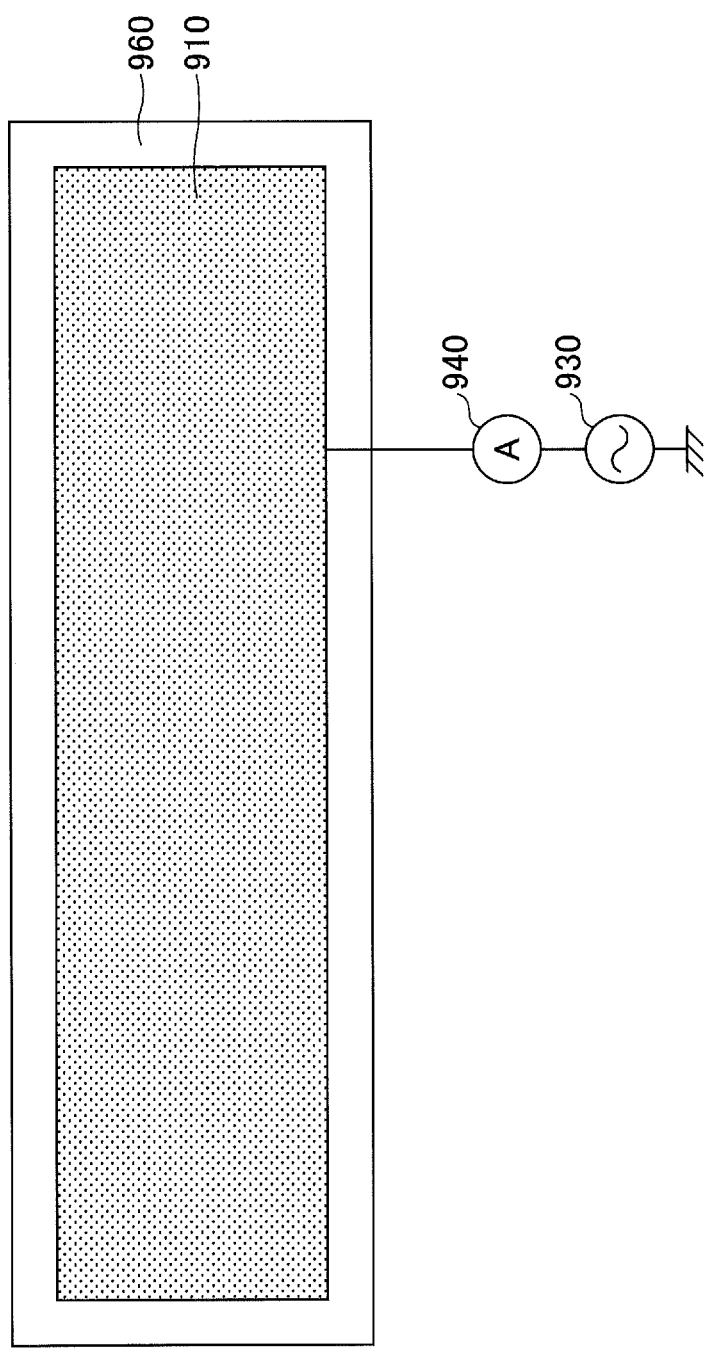
FIG. 1 is a diagram illustrating a structure of an electrostatic sensor.

Embodiments will be described in the following. Those members or the like that are the same are designated by the same reference numerals, and a description thereof will be omitted.

First Embodiment

First, an electrostatic sensor mounted in a door handle or the like will be described. Such an electrostatic sensor is mounted in the door handle of an automobile or the like, and can detect a finger or the like, which is a detection target, approaching the electrostatic sensor, when the finger or the like approaches the electrostatic sensor.

FIG. 1 illustrates the electrostatic sensor mounted in the door handle or the like. This electrostatic sensor includes a detection electrode 910 for detecting an electrostatic capacitance between the finger or the like and the detection electrode 910, and an AC power supply 930 is connected to the detection electrode 910. An ammeter 940 is provided between the detection electrode 910 and the AC power supply 930. A protection layer 960, formed by an insulator such as a resin or the like, is formed in a periphery of the detection electrode 910.

Figure 2:
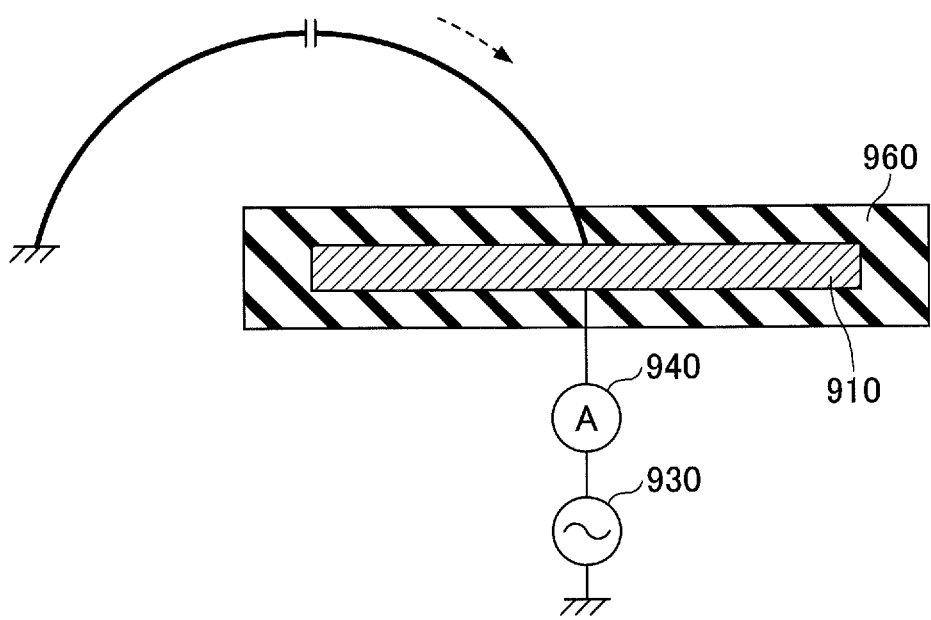
FIG. 2 is a diagram (1) for explaining the electrostatic sensor illustrated in FIG. 1.
Figure 3:
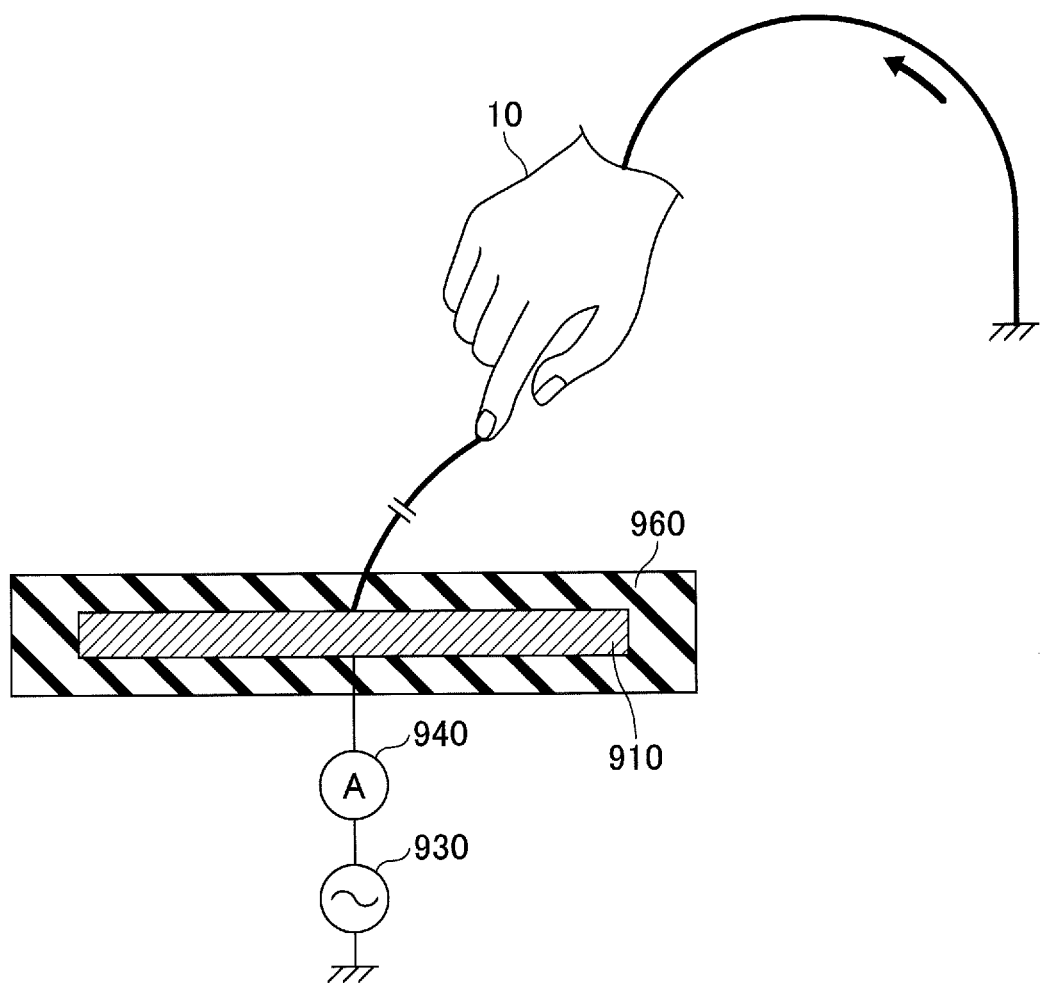
FIG. 3 is a diagram (2) for explaining the electrostatic sensor illustrated in FIG. 1.

In this electrostatic sensor, an AC voltage from the AC power supply 930 is applied to the detection electrode 910, and when the finger or the like is not positioned near the detection electrode 910, the electrostatic capacitance between the detection electrode 910 and a ground potential is extremely small, as illustrated in FIG. 2, and thus, a current that flows from the AC power supply 930 to the detection electrode 910 is extremely small. However, when a finger 10 approaches the detection electrode 910, as illustrated in FIG. 3, the electrostatic capacitance between the finger 10 and the detection electrode 910 becomes a large current, to increase the AC current that flows from the AC power supply 930 toward the detection electrode 910. It is possible to detect the finger 10 or the like approaching the detection electrode 910, by detecting the increase in the AC current by the ammeter 940.

Figure 4:
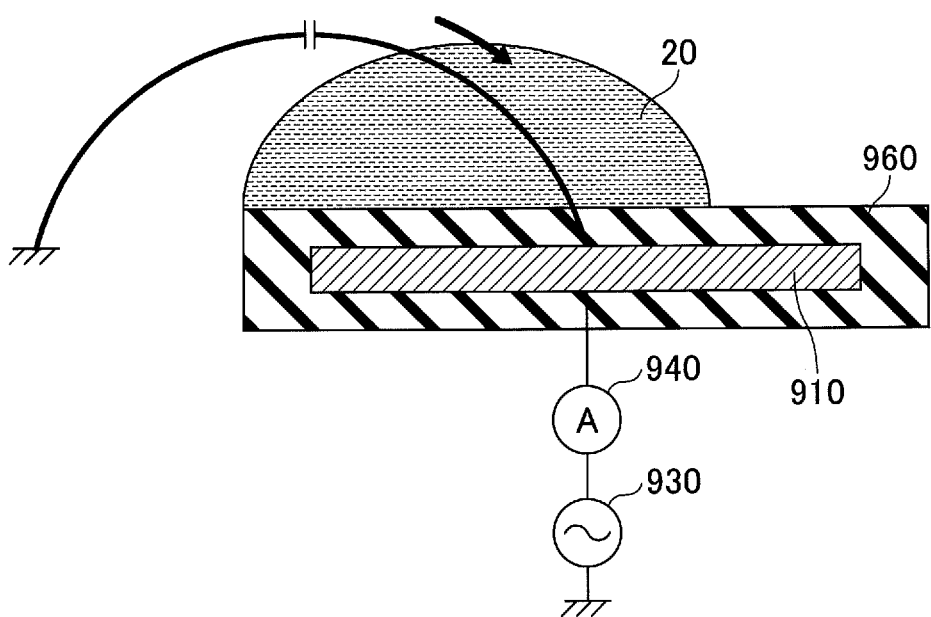
FIG. 4 is a diagram (3) for explaining the electrostatic sensor illustrated in FIG. 1.

When this electrostatic sensor is used in the door handle of the automobile or the like, rainfall may cause a water droplet 20 or the like to adhere to the electrostatic sensor that is mounted in the door handle, as illustrated in FIG. 4, because the automobile or the like may be parked outside. The relative dielectric constant of water is approximately 80 and high, and when the water droplet 20 or the like adheres to the electrostatic sensor, the electrostatic capacitance between the ground potential and the detection electrode 910 becomes large, to increase the AC current that flows from the AC power supply 930 toward the detection electrode 910, and cause the electrostatic sensor to erroneously recognize that the finger 10 is approaching. In other words, when the water droplet 20 or the like adheres to the door handle of the automobile or the like, the current flowing through the ammeter 940 increases, and cause the electrostatic sensor to make an erroneous recognition that the finger 10 or the like is approaching. Such an erroneous recognition is undesirable because an erroneous operation may be recognized when the door is opened or closed or the like. The water droplet 20 or the like may adhere to the door handle in situations other than the rainfall, such as when washing the automobile or the like.

(Electrostatic Sensor and Door Handle)

Next, the electrostatic sensor according to this embodiment, and the door handle will be described.

Figure 5:
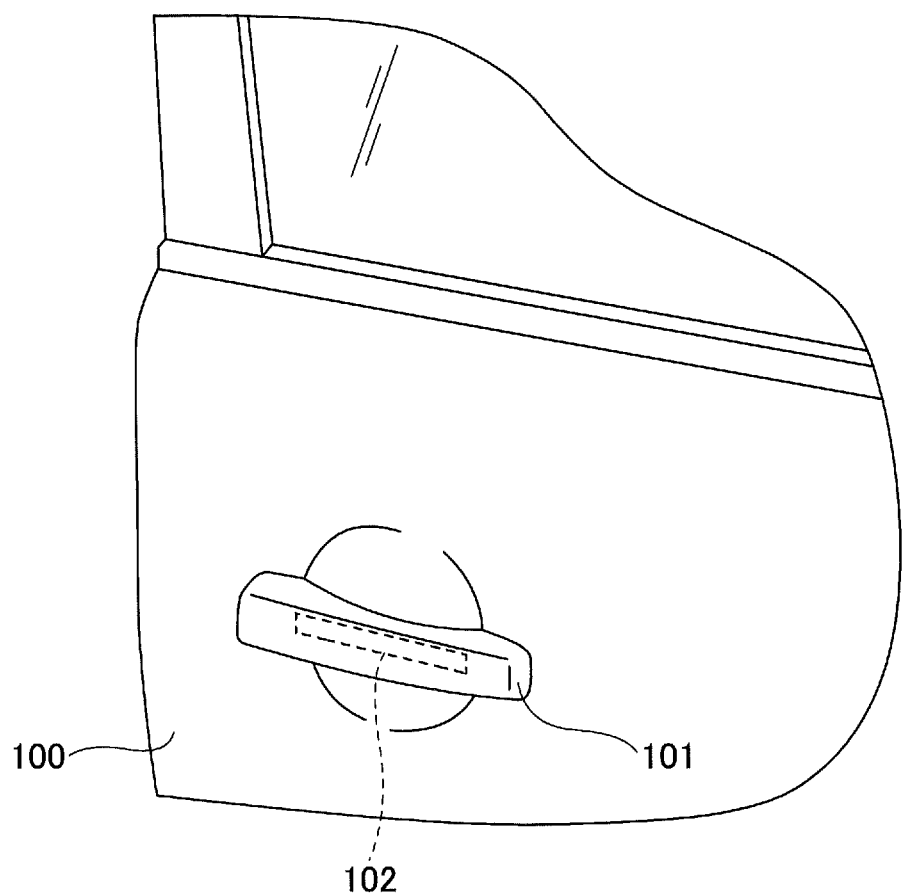
FIG. 5 is a diagram for explaining a door mounted with a door handle according to a first embodiment.
Figure 6:
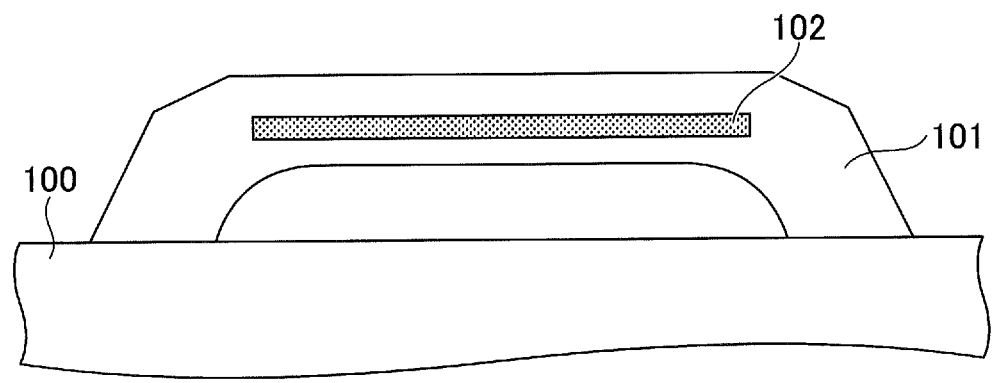
FIG. 6 is a diagram illustrating a structure of the door handle according to the first embodiment.

An electrostatic sensor 102 according to this embodiment is mounted in a door handle 101 of a door 100 of an automobile or the like, as illustrated in FIG. 5 and FIG. 6. The electrostatic sensor 102 can detect the approaching detecting target, such as the finger or the like, by detecting the electrostatic capacitance.

Figure 7:
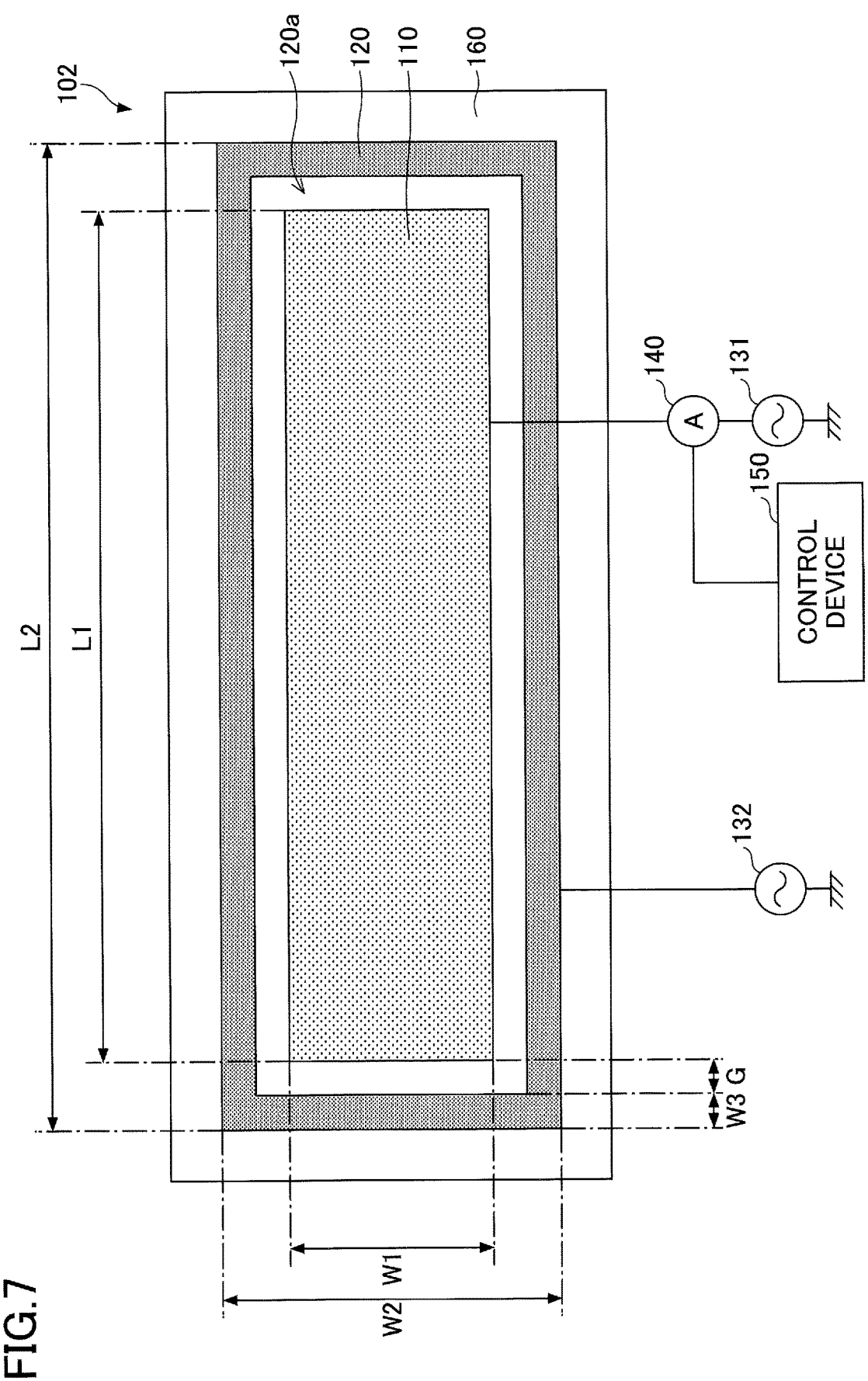
FIG. 7 is a diagram illustrating the structure of the electrostatic sensor according to the first embodiment.

The electrostatic sensor 102 according to this embodiment will be described, by referring to FIG. 7. The electrostatic sensor 102 according to this embodiment includes a detection electrode 110, a shield electrode 120, a first AC power supply 131, a second AC power supply 132, an ammeter 140, a control device 150, or the like. A protection layer 160 formed by an insulator, such as a resin or the like, is formed in a periphery of the detection electrode 110 and the shield electrode 120. In this application, the detection electrode 110 may also be referred to as a first electrode, and the shield electrode 120 may also be referred to as a second electrode. In addition, because the ammeter 140 need only measure a moving quantity of the charge, the ammeter 140 may also be referred to as a charge quantity measuring device.

The detection electrode 110 is formed to an approximately rectangular shape, having a length L1 of approximately 120 mm, and a width W1 of approximately 15 mm. The shield electrode 120 is formed to a hollow rectangular shape, surrounding a periphery of the detection electrode 110, and including an opening 120a at a central portion thereof. An outer shape of the shield electrode 120 has a length L2 of approximately 130 mm, and a width W2 of approximately 25 mm, and a width W3 of the shield electrode 120 is approximately 4.85 mm. Accordingly, the detection electrode 110 is formed inside the opening 120a of the shield electrode 120. A gape G between the outer side of the detection electrode 110 and an inner side of the shield electrode 120 is approximately 0.15 mm.

The first AC power supply 131 is connected to the detection electrode 110 via the ammeter 140. In other words, the ammeter 140 is provided between the detection electrode 110 and the first AC power supply 131. In addition, the second AC power supply 132 is connected to the shield electrode 120. In this embodiment, the voltages are set so that a voltage amplitude of the AC voltage applied from the second AC power supply 132 to the shield electrode 120 is larger than a voltage amplitude of the AC voltage applied from the first AC power supply 131 to the detection electrode 110. In this application, the voltage amplitude of the AC voltage applied from the first AC power supply 131 to the detection electrode 110 may also be referred to as a first voltage amplitude, and the voltage amplitude of the AC voltage applied from the second AC power supply 132 to the shield electrode 120 may also be referred to as a second voltage amplitude. The AC voltages generated from the first AC power supply 131 and the second AC power supply 132 have the same frequency and the same phase. The frequency of the AC voltages generated by the first AC power supply 131 and the second AC power supply 132 is 100 kHz, for example.

In this embodiment, the AC current can be supplied from the first AC power supply 131 to the detection electrode 110, and the AC current supplied to the detection electrode 110 can be measured by the ammeter 140. In addition, the AC current can be supplied from the second AC power supply 132 to the shield electrode 120. The ammeter 140 is connected to the control device 150, and the control device 150 performs various judgments based on the value of the AC current detected by the ammeter 140.

(Detection Method 1 of Electrostatic Sensor)

Next, the electrostatic sensor according to this embodiment will be described for the case where the water droplet 20 adheres thereto, and for the case where the finger 10 or the like approaches thereto. In the following, the current that is described is the AC current, and thus, it is regarded that the described current is an effective current.

First, a case where the water droplet 20 is not adhered to a detection surface 102a of the electrostatic sensor 102 according to this embodiment, and the finger 10 or the like is not approaching the electrostatic sensor 102, will be described by referring to FIG. 8. In this case, the AC voltage from the first AC power supply 131 is applied to the detection electrode 110, and the second AC power supply 132 is connected to the shield electrode 120.

Accordingly, when an electrostatic capacitance C1a exists, a current I1a flows, because the AC voltage from the first AC power supply 131, having a first voltage amplitude Vs1, is applied to the detection electrode 110. In addition, when an electrostatic capacitance C2a exists, a current I2a flows, because the AC voltage from the second AC power supply 132, having a second voltage amplitude Vs2 and applied to the shield electrode 120, is larger than the first voltage amplitude Vs1 of the AC voltage from the first AC power supply 131 applied to the detection electrode 110. When the water droplet 20 is not adhered to the electrostatic sensor 102 according to this embodiment, and further, the finger 10 or the like is not approaching this electrostatic sensor 102, the electrostatic capacitance C1a between the detection electrode 110 and the ground potential, and the electrostatic capacitance C2a between the detection electrode 110 and the shield electrode 120, are extremely small. Accordingly, the current I1a and the current I2a are also extremely small, and I1a≈I2a≈0, and I1a−I2a≈0. However, depending on the sensor structure, these currents may become no longer negligible. Hence, an amount of change is regarded as the detection value by using, as a reference value, an initial value of each of the current values for the case where the water droplet 20 is not adhered to and the finger 10 or the like is not approaching the electrostatic sensor.

Next, a case where the finger 10 or the like is approaching the detection surface 102a of the electrostatic sensor 102 according to this embodiment, will be described by referring to FIG. 9. In this case, because the finger or the like approaches the detection electrode 110 of the electrostatic sensor 102, the electrostatic capacitance C1b between the detection electrode 110 and the finger 10 or the like becomes large compared to the electrostatic capacitance C1a, however, the electrostatic capacitance C2b between the detection electrode 110 and the shield electrode 120 does not become large compared to the electrostatic capacitance C2a. Accordingly, because an increase in the electrostatic capacitance from the electrostatic capacitance C1a to the electrostatic capacitance C1b becomes larger than an increase in the electrostatic capacitance from the electrostatic capacitance C2a to the electrostatic capacitance C2b, an increase from the current I1a to the current I1b becomes larger than an increase from the current I2a to the current I2b, I1b−I1a>I2b−I2a, and (I1b−I1a)−(I2b−I2a)>0.

Next, a case where the water droplet 20 is adhered to the detection surface 102a of the electrostatic sensor 102 according to this embodiment, will be described by referring to FIG. 10. In this case, because the water droplet 20 is adhered near the detection electrode 110 and the shield electrode 120 of the electrostatic sensor 102, an electrostatic capacitance C1c between the detection electrode 110 and the ground potential becomes slightly larger when compared to the electrostatic capacitance C1a, however, an electrostatic capacitance C2c between the detection electrode 110 and the shield electrode 120 becomes even larger when compared to the electrostatic capacitance C2a. Accordingly, because an increase from the electrostatic capacitance C2a to the electrostatic capacitance C2c becomes larger than an increase from the electrostatic capacitance C1a to the electrostatic capacitance C1c, an increase (I2c−I2a) from the current I2a to the current I2c becomes larger than an increase (I1c−I1a) from the current I1a to the current I1c, (I1c−I1a)<(I2c−I2a), and (I1c−I1a)−(I2c−I2a)<0.

When a current flowing between the detection electrode 110 and the ground potential at an arbitrary point in time is denoted by I1, and a current flowing between the detection electrode 110 and the shield electrode 120 is denoted by I2, the ammeter 140 can detect a difference between the current I1 and the current I2. In addition, when I1a−I2a is regarded as a reference value for the current I1 and the current I2, this reference value may be stored in the control device 150. Accordingly, by detecting the current in the ammeter 140, it is possible to detect whether the finger 10 or the like is approaching the electrostatic sensor 102, and to detect whether the water droplet 20 is adhered to the electrostatic sensor 102.

More particularly, in a case where a threshold value Ith is provided, (I1−I1a)−(I2−I2a)≈0, and a difference between I1 and I2 is the threshold value Ith or less, that is, when |(I1−I1a)−(I2−I2a)|<=Ith, it may be judged that the water droplet 20 is not adhered to the electrostatic sensor 102, and that the finger 10 or the like is not approaching the electrostatic sensor 102.

In a case where |(I1−I1a)−(I2−I2a)|>Ith, and (I1−I1a)−(I2−I2a)>0, it may be judged that the finger 10 or the like is approaching the electrostatic sensor 102.

In a case where |(I1−I1a)−(I2−I2a)|>Ith, and (I1−I1a)−(I2−I2a)<0, it may be judged that the water droplet 20 or the like is adhered to the electrostatic sensor 102.

The above described judgments may be performed in the control device 150.

A case may be assumed in which the finger 10 or the like approaches the electrostatic sensor 102 according to this embodiment in a state where the water droplet 20 is adhered to the electrostatic sensor 102. In such a case, the layout and shape of the detection electrodes 110 and the shield electrode 120, and the AC voltages having the first voltage amplitude Vs1 and the second voltage amplitude Vs2, may be adjusted so that it is possible to distinguish the approaching finger 10 or the like in this state.

(Detection Method 2 of Electrostatic Sensor)

Next, the detection method of the electrostatic sensor according to this embodiment will be described from another viewpoint, by referring to a case where the judgment is performed based on the following formula (1).

$$S=k\times[Vs1\times C1-\{(Vs2-Vs1)\times C2\}] \quad (1)$$

S denotes a detection signal that is obtained based on the current measured by the ammeter 140, Vs1 denotes a first voltage amplitude of the AC voltage applied from the first AC power supply 131 to the detection electrode 110, Vs2 denotes a second voltage amplitude of the AC voltage applied from the second AC power supply 132 to the shield electrode 120, C1 denotes an electrostatic capacitance between the detection electrode 110 and the ground potential, C2 denotes an electrostatic capacitance between the detection electrode 110 and the shield electrode 120, and k denotes a constant of proportionality having a positive value.

Figure 8:
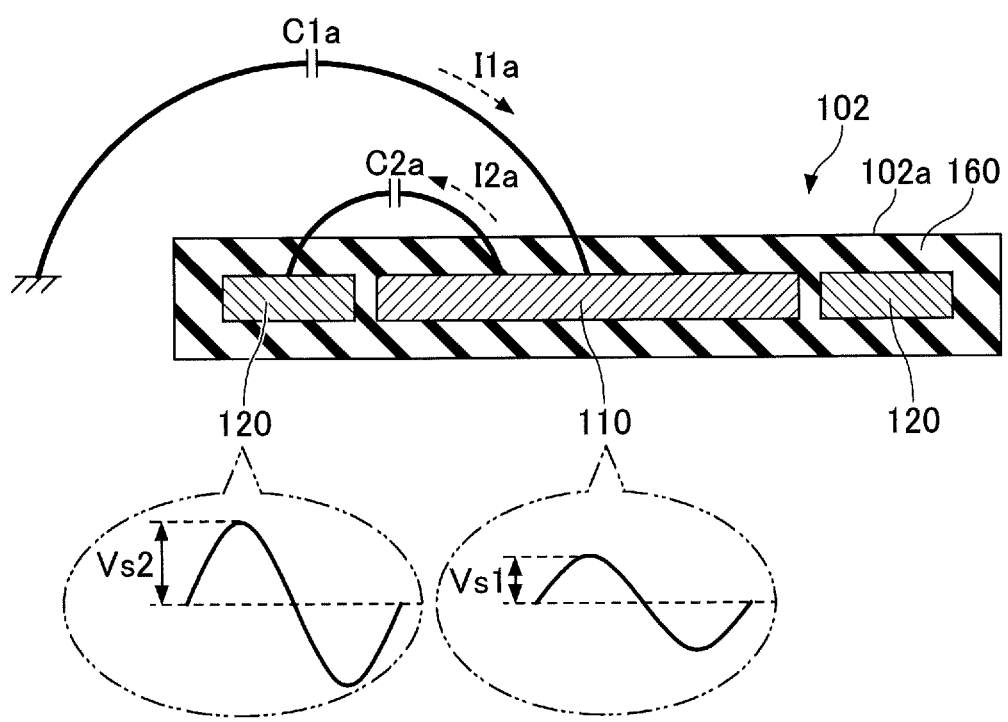
FIG. 8 is a diagram (1) for explaining the electrostatic sensor according to the first embodiment.

As illustrated in FIG. 8, in the case where the water droplet 20 is not adhered to the detection surface 102a of the electrostatic sensor 102 according to this embodiment, and the finger 10 or the like is not approaching the electrostatic sensor 102, a detection signal Sa takes a value obtained from the following formula (2). In this case, it is possible to make adjustments so that C1a≈C2a≈0. In this case, Sa≈0.

$$Sa=k\times[Vs1\times C1a-\{(Vs2-Vs1)\times C2a\}] \quad (2)$$

Figure 9:
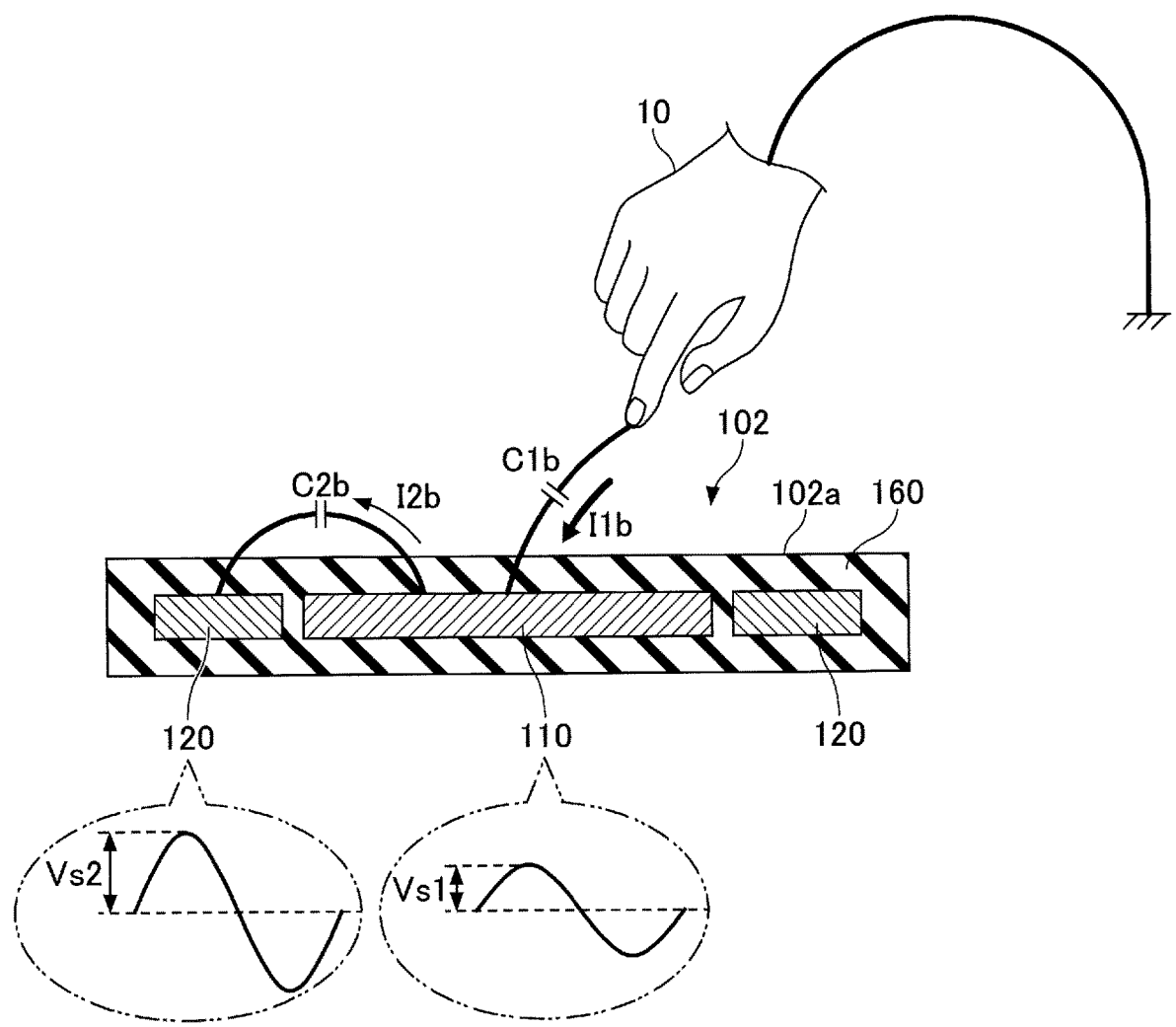
FIG. 9 is a diagram (2) for explaining the electrostatic sensor according to the first embodiment.

In addition, as illustrated in FIG. 9, in the case where the finger 10 or the like is approaching the detection surface 102a of the electrostatic sensor 102 according to this embodiment, a detection signal Sb takes a value obtained from the following formula (3). In this case, both the electrostatic capacitance C1b and the electrostatic capacitance C2b increase, however, the amount of increase in the electrostatic capacitance C1b is large compared to the amount of increase in the electrostatic capacitance C2b. Accordingly, because C1a<<C1b, C2a<C2b, and Sb>Sa.

$$Sb=k\times[Vs1\times C1b-\{(Vs2-Vs1)\times C2b\}] \quad (3)$$

Figure 10:
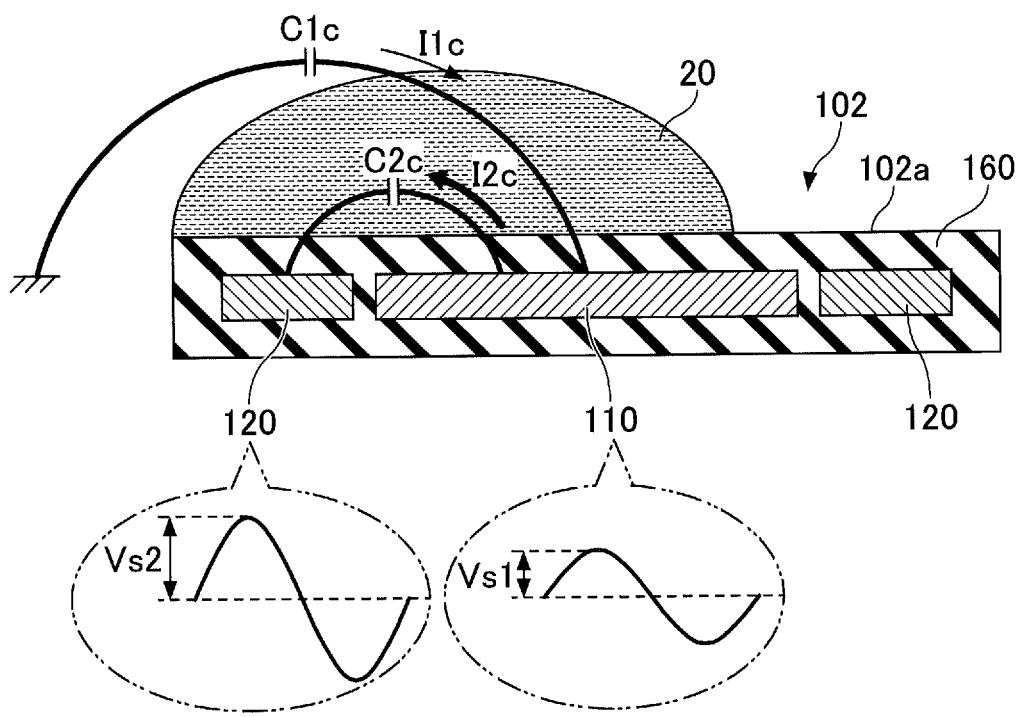
FIG. 10 is a diagram (3) for explaining the electrostatic sensor according to the first embodiment.

Next, as illustrated in FIG. 10, in the case where the water droplet 20 adheres to the detection surface 102a of the electrostatic sensor 102 according to this embodiment, a detection signal Sc takes a value obtained from the following formula (4). In this case, both the electrostatic capacitance C1c and the electrostatic capacitance C2c increase, however, the amount of increase in the electrostatic capacitance C2c is large compared to the amount of increase in the electrostatic capacitance C1c. Accordingly, because C1a<C1c and C2a<<C2c, Sc<Sa.

$$Sc=k\times[Vs1\times C1c-\{(Vs2-Vs1)\times C2c\}] \quad (4)$$

Accordingly, based on the value measured by the ammeter 140, it is possible to determine whether the water droplet 20 is adhered to the electrostatic sensor 102 according to this embodiment, or whether the finger or the like is approaching the electrostatic sensor 102.

In other words, first, in the state where the droplet 20 is not adhered to and the finger or the like is not approaching the electrostatic sensor 102 according to this embodiment, the detection signal Sa is computed based on the current measured by the ammeter 140, and the value of this detection signal Sa is stored in a storage device that is not illustrated and is provided in the control device 150. Thereafter, in the case where the value of the detection signal S computed based on the value measured by the ammeter 140 satisfies S<Sa, it can be determined that the water droplet 20 is adhered to the electrostatic sensor 102 according to this embodiment. On the other hand, in the case where the value of the detection signal S computed based on the value measured by the ammeter 140 satisfies S<Sa, it can be determined that the finger or the like is approaching the electrostatic sensor 102 according to this embodiment.

Further, in this embodiment, the door 100 may be unlocked or locked by a gesture operation or the like by the finger 10 or the like. More particularly, in the case where the detection target, such as the finger 10 or the like, approaches near the detection surface 102a of the electrostatic sensor 102 according to this embodiment, the door handle 101 may be unlocked or locked when the change in the electrostatic capacitance between the finger 10 or the like and the detection electrode 110, corresponding to a predetermined motion of the finger 10 or the like, is detected.

(Modifications)

Next, modifications of the electrostatic sensor according to this embodiment will be described.

Figure 11:
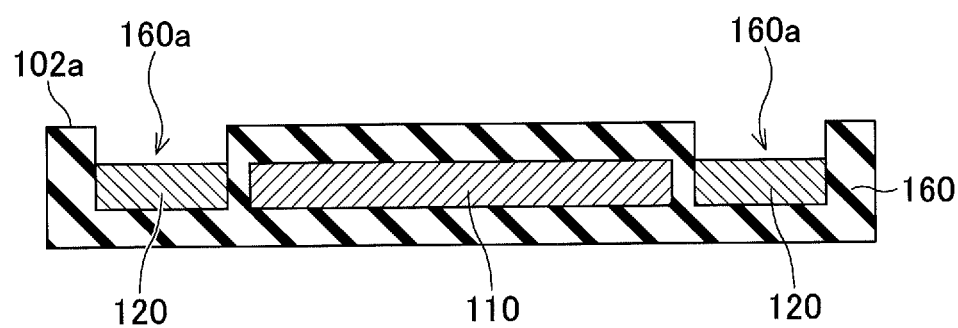
FIG. 11 is a diagram illustrating the structure of a first modification of the electrostatic sensor according to the first embodiment.
Figure 12:
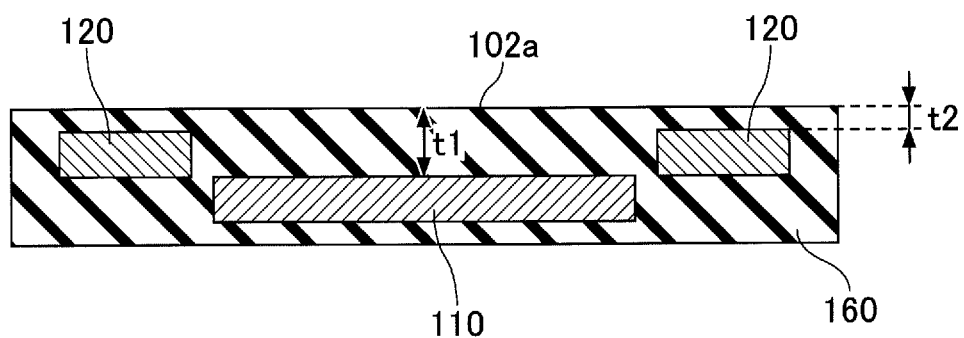
FIG. 12 is a diagram illustrating the structure of a second modification of the electrostatic sensor according to the first embodiment.

In the electrostatic sensor according to this embodiment, the protection layer 160 formed by the insulator, such as the resin or the like, is formed in the periphery of the detection electrode 110 and the shield electrode 120. However, as illustrated in FIG. 11, the protection layer 160 may be provided with an opening 160a at an upper surface thereof on the side of the detection surface 102a in a region where the shield electrode 120 is formed. The protection layer 160 is formed by the resin material, such as polychlorinated biphenyl (PCB) or the like, having a relative dielectric constant of approximately 4 which is not high compared to that of water. For this reason, by forming the opening 160a by removing the protection layer 160 at the upper surface thereof in the region where the shield electrode 120 is formed, the change in the electrostatic capacitance can be made large for the case where the water droplet 20 or the like adheres to the shield electrode 120, to thereby improve the detection sensitivity.

In addition, even when the relative dielectric constant of the protection layer 160 is low, it is possible to make the electrostatic capacitance large by reducing the thickness of the protection layer 160 on the side of the detection surface 102a on the shield electrode 120. In other words, when a distance from the surface of the protection layer 160 to the shield electrode 120 is shorter than a distance from the surface of the protection layer 160 to detection electrode 110, the electrostatic capacitance between the detection electrode 110 and the shield electrode 120 can be made relatively large. Accordingly, a thickness t2 of the protection layer 160 on the side of the detection surface 102a covering the upper surface of the shield electrode 120 may be made smaller than a thickness t1 of the protection layer 160 on the side of the detection surface 102a covering the upper surface of the detection electrode 110. In this case, the thickness t1 of the protection layer 160 covering the upper surface of the detection electrode 110 may be approximately 3 mm, and the thickness t2 of the protection layer 160 covering the upper surface of the shield electrode 120 may be approximately 1 mm, for example.

Figure 13:
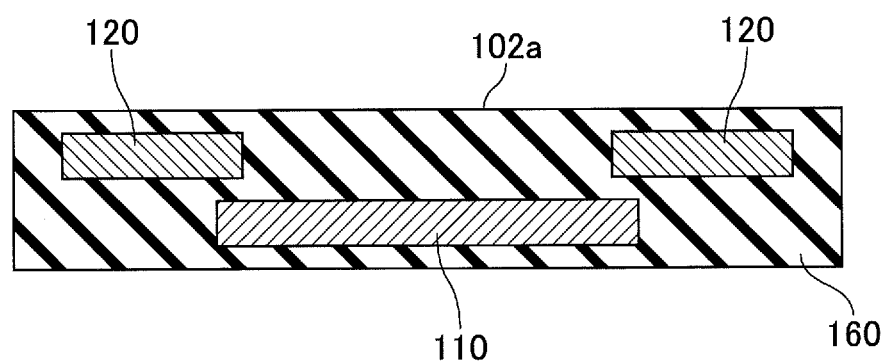
FIG. 13 is a diagram illustrating the structure of a third modification of the electrostatic sensor according to the first embodiment.

Further, in this case, the shield electrode 120 may be provided above the detection electrode 110 to partially overlap the periphery of the detection electrode 110, as illustrated in FIG. 13. In other words, in a plan view from above the electrostatic sensor from the side of the detection surface 102a, a portion of the periphery of the detection electrode 110 and the shield electrode 120 may overlap. The protection layer 160 electrically insulates inbetween the detection electrode 110 and the shield electrode 120.

Figure 14A:
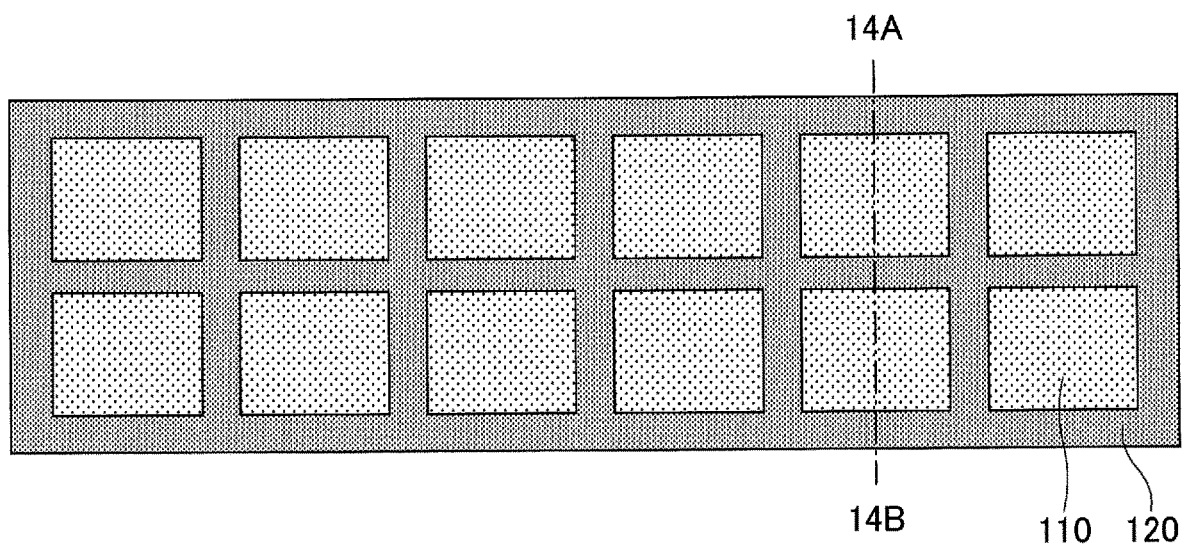
FIG. 14A is a diagram (1) illustrating the structure of a fourth modification of the electrostatic sensor according to the first embodiment.
Figure 14B:
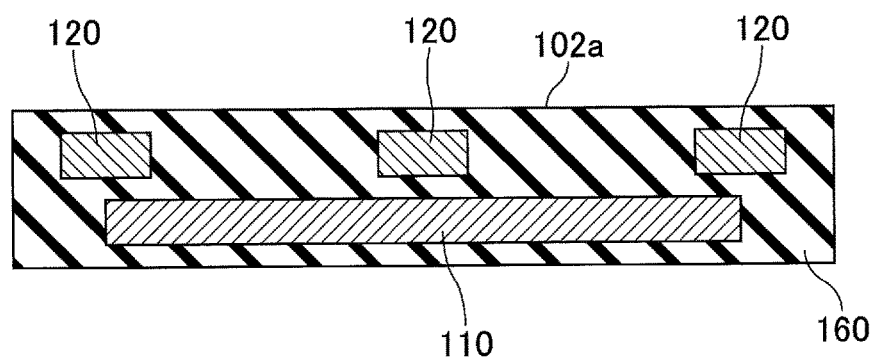
FIG. 14B is a diagram (2) illustrating the structure of the fourth modification of the electrostatic sensor according to the first embodiment.

Moreover, in the electrostatic sensor according to this embodiment, the shield electrode 120 may be provided not only in the periphery of the detection electrode 110, but also on the side of the detection surface 102a of the detection electrode 110, so as to traverse portions of the detection electrode 110 in vertical and horizontal directions, as illustrated in FIG. 14A and FIG. 14B. In other words, the shield electrode 120 may be provided in a grid-like pattern on the side of the detection surface 102a of the detection electrode 110. FIG. 14A is a diagram illustrating the layout of the detection electrode 110 and the shield electrode 120 when viewed from above the electrostatic sensor, and FIG. 14B is a cross sectional view cut along a one-dot chain line 14A-14B in FIG. 14A.

Figure 15:
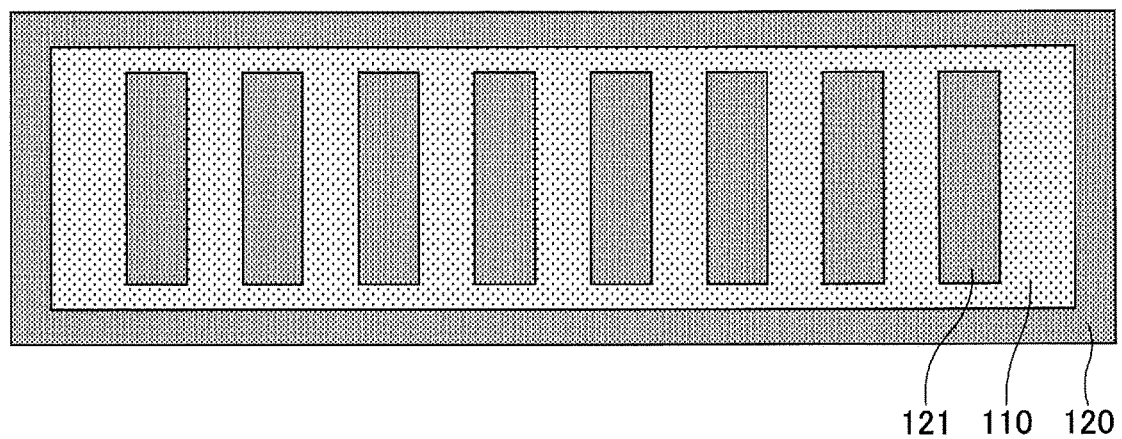
FIG. 15 is a diagram illustrating the structure of a modification 5 of the electrostatic sensor according to the first embodiment.

Furthermore, as illustrated in FIG. 15, one or two or more shield electrodes 121 may be provided on an inner side of the shield electrode 120 that is provided in the periphery of the detection electrode 110. In other words, one or two or more shield electrodes 121 may be provided on the side of the detection surface 102a of the detection electrode 110. In the electrostatic sensor illustrated in FIG. 15, the shield electrode 120 and the shield electrodes 121 are electrically connected on the outer side of the electrostatic sensor.

Second Embodiment

Figure 16:
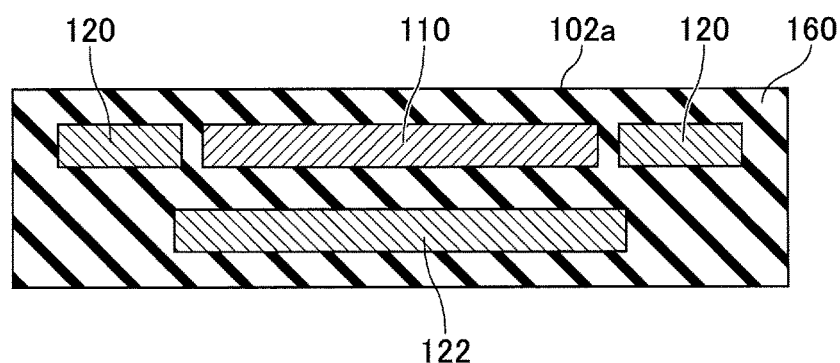
FIG. 16 is a diagram illustrating the structure of the electrostatic sensor according to a second embodiment.

Next, the electrostatic sensor according to a second embodiment will be described. As illustrated in FIG. 16, the electrostatic sensor according to this embodiment has a structure in which a back shield electrode 122 is provided to cover a back surface of the detection electrode 110 on the side opposite to the side of the detection surface 102a. By providing the back shield electrode 122, it is possible to block noise from the back surface side of the detection electrode 110, to thereby improve the detection sensitivity. The shield electrode 120 and the back shield electrode 12 may be electrically connected.

Figure 17:
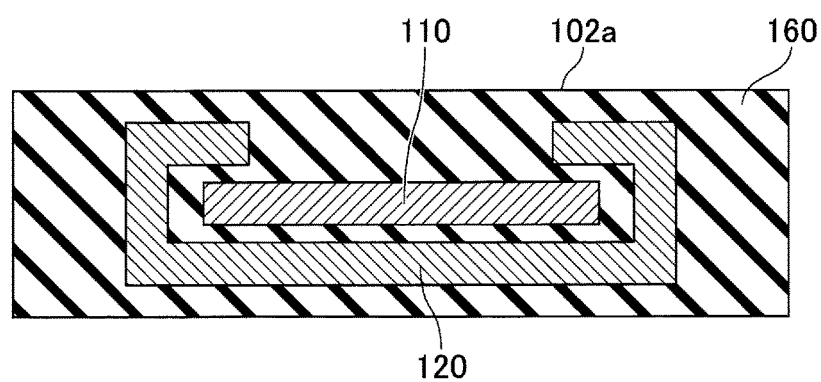
FIG. 17 is a diagram illustrating the structure of a modification of the electrostatic sensor according to the second embodiment.

Further, as illustrated in FIG. 17, the electrostatic sensor according to this embodiment may have a structure in which the shield electrode 120 surrounds portions excluding the upper surface side on side of the detection surface 102a of the detection electrode 110. In this case, the back shield electrode 122 can be formed integrally with the shield electrode 120, and the effects of noise from the side surface portion of the electrostatic sensor can be reduced.

Unless otherwise indicated, the features of this embodiment are the same as those of the first embodiment.

According to the disclosed electrostatic sensor, it is possible to distinguish between adhesion of water droplets and an operation made by a finger or the like, to prevent an erroneous detection caused by the water droplets.

Although the embodiments and modifications are numbered with, for example, "first," "second," etc., the ordinal numbers do not imply priorities of the embodiments and modifications. Many other variations and modifications will be apparent to those skilled in the art.

Although embodiments are described in detail above, the present invention is not limited to particular embodiments, and various variations and modifications may be made without departing from the scope of the present invention.

What is claimed is:

1. An electrostatic sensor, comprising:
   a detection electrode;
   a shield electrode provided in a periphery of the detection electrode;
   a first AC power supply, coupled to the detection electrode, and configured to generate an AC voltage having a first voltage amplitude;
   a second AC power supply, coupled to the shield electrode, and configured to generate an AC voltage having a second voltage amplitude;
   a charge quantity measuring device configured to measure a quantity of charge flowing from the first AC power supply to the detection electrode; and
   a control device coupled to the charge quantity measuring device,
   wherein the AC voltage generated by the first AC power supply and the AC voltage generated by the second AC power supply have the same frequency and the same phase,
   wherein the second voltage amplitude of the AC voltage generated by the second AC power supply is larger than the first voltage amplitude of the AC voltage generated by the first AC power supply, and
   wherein a detection target on a side of a detection surface is detected based on a change in an electrostatic capacitance between the detection electrode and the detection target.

2. The electrostatic capacitance as claimed in claim 1, wherein the control device determines that a water droplet is adhered to the detection surface, when a detection signal that is obtained based on a moving quantity of the charge that is measured by the charge quantity measuring device is smaller than a predetermined value.

3. The electrostatic sensor as claimed in claim 1, wherein the control device determines that the detection target is approaching the detection surface, when a detection signal that is obtained based on a moving quantity of the charge that is measured by the charge quantity measuring device is larger than a predetermined value.

4. The electrostatic sensor as claimed in claim 1, wherein a detection signal S takes a value obtained from $S=k\times[Vs1\times C1-\{(Vs2-Vs1)\times C2\}]$, where Vs1 denotes the first voltage amplitude of the AC voltage applied from the first AC power supply to the detection electrode, Vs2 denotes the second voltage amplitude of the AC voltage applied from the second AC power supply to the shield electrode, C1 denotes an electrostatic capacitance between the detection electrode and a ground potential, C2 denotes an electrostatic capacitance between the detection electrode and the shield electrode, and k denotes a constant of proportionality having a positive value, and
the control device determines that a water droplet is adhered to the detection surface when the detection signal S has a value smaller than a predetermined value.

5. The electrostatic sensor as claimed in claim 1, wherein the detection electrode and the shield electrode are covered by a protection layer that is formed by an insulator.

6. The electrostatic sensor as claimed in claim 5, wherein a distance from a surface of the protection layer to the shield electrode is shorter than a distance from the surface of the protection layer to the detection electrode.

7. The electrostatic sensor as claimed in claim 5, wherein the protection layer includes an opening at an upper surface thereof on a side of the detection surface in a region where the shield electrode is provided.

8. The electrostatic sensor as claimed in claim 5, wherein a portion of the detection electrode overlaps the shield electrode in a plan view from above the electrostatic sensor from a side of the detection surface.

9. The electrostatic sensor as claimed in claim 5, wherein the shield electrode is provided in a grid-like pattern above the detection electrode.

10. The electrostatic sensor as claimed in claim 5, wherein the shield electrode is provided in the periphery of the detection electrode, above the detection electrode, and further comprising:
   one or two or more other shield electrodes provided on an inner side of the shield electrode,
   wherein the shield electrode and the other shield electrodes are electrically connected.

11. The electrostatic sensor as claimed in claim 5, further comprising:
   a back shield electrode provided on a side opposite to the detection surface of the detection electrode.

12. The electrostatic sensor as claimed in claim 11, wherein the shield electrode and the back shield electrode are electrically connected.

13. The electrostatic sensor as claimed in claim 1, wherein the shield electrode is provided in the periphery of the detection electrode, above the detection electrode, and further comprising:
   one or two or more other shield electrodes provided on an inner side of the shield electrode,
   wherein the shield electrode and the other shield electrodes are electrically connected.

14. A door handle comprising:
   the electrostatic sensor according to claim 1.

15. The door handle as claimed in claim 14, wherein the control device unlocks or locks the door handle, when the detection target approaches near the detection surface of the electrostatic sensor, and detects a predetermined change in an electrostatic capacitance between the detection target the detection electrode, corresponding to a motion of the detection target.

16. The door handle as claimed in claim 15, wherein the control device determines that a water droplet is adhered to the detection surface, when a detection signal that is obtained based on a moving quantity of the charge that is measured by the charge quantity measuring device is smaller than a predetermined value.

17. The door handle as claimed in claim 15, wherein the control device determines that the detection target is approaching the detection surface, when a detection signal that is obtained based on a moving quantity of the charge that is measured by the charge quantity measuring device is larger than a predetermined value.

18. The door handle as claimed in claim 15, wherein
a detection signal S takes a value obtained from $S = k \times [Vs1 \times C1 - \{(Vs2 - Vs1) \times C2\}]$, where Vs1 denotes the first voltage amplitude of the AC voltage applied from the first AC power supply to the detection electrode, Vs2 denotes the second voltage amplitude of the AC voltage applied from the second AC power supply to the shield electrode, C1 denotes an electrostatic capacitance between the detection electrode and a ground potential, C2 denotes an electrostatic capacitance between the detection electrode and the shield electrode, and k denotes a constant of proportionality having a positive value, and
the control device determines that a water droplet is adhered to the detection surface when the detection signal S has a value smaller than a predetermined value.

19. The door handle as claimed in claim 15, wherein the detection electrode and the shield electrode are covered by a protection layer that is formed by an insulator.

20. The door handle as claimed in claim 15,
wherein the shield electrode is provided in the periphery of the detection electrode, above the detection electrode, and
wherein the electrostatic sensor further comprising:
one or two or more other shield electrodes provided on an inner side of the shield electrode, the shield electrode and the other shield electrodes being electrically connected.

* * * * *